(12) United States Patent
Havens et al.

(10) Patent No.: US 6,850,066 B2
(45) Date of Patent: * Feb. 1, 2005

(54) SYSTEMS AND METHODS FOR GRADIENT COMPENSATION IN MAGNETIC RESONANCE IMAGING

(75) Inventors: Timothy J. Havens, Florence, SC (US); Xianrui Huang, Clifton Park, NY (US); David T Ryan, Niskayuna, NY (US)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/438,523

(22) Filed: May 15, 2003

(65) Prior Publication Data

US 2004/0227511 A1 Nov. 18, 2004

(51) Int. Cl.[7] .............................................. G01V 3/00
(52) U.S. Cl. ...................................... 324/318; 324/322
(58) Field of Search ............................. 324/322, 318, 324/300, 307, 309, 312, 319

(56) References Cited

U.S. PATENT DOCUMENTS

| | | | |
|---|---|---|---|
| 5,200,701 A | * | 4/1993 | Siebold et al. ............... 324/309 |
| 5,227,728 A | * | 7/1993 | Kaufman et al. ............ 324/322 |
| 5,347,252 A | * | 9/1994 | Ries ............................ 335/299 |
| 6,362,623 B1 | | 3/2002 | Goto |
| 6,396,268 B1 | | 5/2002 | Hinks et al. |
| 6,429,655 B1 | | 8/2002 | Overweg |
| 6,448,773 B1 | | 9/2002 | Zhang |
| 6,456,076 B1 | | 9/2002 | Joseph |
| 6,469,604 B1 | | 10/2002 | Palkovich et al. |
| 6,479,998 B1 | | 11/2002 | Yui et al. |
| 6,479,999 B1 | | 11/2002 | DeMeester et al. |

* cited by examiner

Primary Examiner—Louis Arana
(74) Attorney, Agent, or Firm—Christopher L. Bernard, Esq.

(57) ABSTRACT

A gradient compensation system comprising a magnet assembly, at least one field-generating gradient coil operable for generating magnetic field gradients in three orthogonal coordinates, and at least one gradient compensation coil positioned adjacent to the magnet assembly and operable for generating a magnetic field to compensate for leakage fields. A system for eliminating image distortion in magnetic resonance imaging comprising a magnet assembly comprising an imaging gradient coil and an imaging volume, and at least one gradient compensation coil positioned adjacent to the magnet assembly operable for generating gradient compensation fields in response to the magnetic field change. A method for counter-acting unwanted fields generated by eddy currents in conducting structures of a magnetic resonance system comprising generating a magnetic field change signal indicative of a change in a magnetic field of an imaging volume, determining a compensation signal in response to the magnetic field change signal, adding at least one gradient compensation coil to the magnetic resonance imaging system, and controlling current through the at least one gradient compensation coil.

16 Claims, 2 Drawing Sheets

SYSTEMS AND METHODS FOR GRADIENT COMPENSATION IN MAGNETIC RESONANCE IMAGING

BACKGROUND OF THE INVENTION

1. Field of the Invention

The present invention relates generally to the field of magnetic resonance imaging (MRI) coils. More particularly, the present invention relates to the use of additional coils in MRI system design operable for producing fields which counteract fields generated by eddy currents in nearby conducting structures.

2. Description of the Related Art

Magnetic resonance imaging (MRI) is a widely accepted and commercially available technique for obtaining digitized visual images representing the internal structures of objects, such as the tissues of the human body, having substantial populations of atomic nuclei that are susceptible to nuclear magnetic resonance (NMR) phenomena. In MRI, the nuclei in a structure to be imaged are polarized by imposing a strong, uniform magnetic field on the nuclei. Selected nuclei are then excited by imposing a radio frequency (RF) signal at a predetermined NMR frequency. By doing this repeatedly while applying different magnetic field gradients and suitably analyzing the resulting RF responses from the nuclei, a map or image of the relative NMR responses as a function of nuclei location may be determined. Data representing the NMR responses in space may be displayed.

The static magnetic field must be very stable and very strong. Typically, the z-axis is parallel to the axis of the main magnetic field for systems in which the magnet has cylindrical geometry, such as for whole subject imaging. The gradient coils create a magnetic field within the coil with a linear spatial gradient, also referred to as a magnetic gradient. Two different types of gradient coils are typically used to produce magnetic gradients for MRI, one for creating a magnetic gradient along the longitudinal axis of the coil (z axis), and a second for creating magnetic gradients along either the x or y transverse axes.

A conventional MRI system further includes a metallic cylinder referred to as a bore tube. The volume inside of the bore tube is referred to as the image volume. Most imaging occurs in the central portion of the bore tube. The current in the gradient coils induces eddy currents in the bore tube and other conducting structures of the magnet of the MRI system that, in turn, induce a magnetic field within the image volume, referred to as the error field. The magnetic field created by the eddy currents is undesirable in the image volume. The gradient fields must be well defined during the encoding process or the image produced will be distorted. In order to obtain a clear image, it is necessary to reduce or eliminate these eddy current fields.

Conventional attempts at reducing eddy currents include surrounding each gradient coil with a shielding coil. A gradient coil and its associated shielding coil make up what is referred to as a "shielded gradient coil set." The gradient coil may be referred to as the "inner coil," and the shielding coil may be referred to as the "outer coil." The function of the shielding coil is to induce electric fields in the region outside of the outer coil. Ideally, the shielding coil is designed to exactly cancel the electric and magnetic field outside of the coil set. Eliminating the field outside of the shielded gradient coil set effectively eliminates the eddy currents that may be induced in the conducting structures of the MRI system, resulting in no error field being produced in the imaging volume.

One problem with this conventional shielding approach is that it is impossible to exactly cancel the field outside of the z-gradient coil set. A continuous surface current distribution would be required on the surface of the shielding coil to exactly cancel the field outside of the gradient coil set. Conventional shielding simulates a continuous surface current distribution by winding several discrete circular loops around a support structure, however, these discrete circular loops cannot exactly simulate a continuous surface distribution, and therefore, never exactly cancel the field outside of the gradient coil set. Another problem with the shielding approach is that it is accomplished at considerable cost in gradient coil build. Furthermore, this practice requires space in the magnet, which further increases the cost of the magnet.

It would therefore be desirable to improve the quality of a magnetic resonance image by producing fields which counteract fields generated by eddy currents in nearby conductors, without employing a shielding coil approach. It would also be desirable to eliminate resultant eddy currents in folded gradient or 3D-gradient designs where it is extremely difficult to design adequate self-shielding, or for designs in which the gradient coil is completely unshielded and effort is made to make the magnet of substantially non-conducting materials.

BRIEF SUMMARY OF THE INVENTION

In one embodiment, the present invention describes a gradient compensation system comprising a magnet assembly, field-generating gradient coils operable for generating magnetic field gradients in three orthogonal coordinates, gradient compensation coils positioned adjacent to the magnet assembly and operable for generating a magnetic field in response to the compensation signal to compensate for the leakage fields, and a control computer operable for appropriate current control through the compensation coils. In another embodiment, the present invention may further comprise at least one sensor operable for detecting leakage fields in an image volume and generating a compensation signal.

In a further embodiment, the present invention provides a magnetic resonance system which eliminates unwanted eddy current fields. The system comprises a magnet assembly, field-generating gradient coils operable for generating magnetic field gradients in three orthogonal coordinates, a cylindrical bore tube forming an image volume therein, one or more radio frequency coils, a first gradient compensation coil positioned adjacent to the magnet assembly and operable for generating a magnetic field in response to the compensation signal to compensate for the leakage fields, and a control computer. In a still further embodiment, the present invention may comprise at least one sensor operable for detecting leakage fields in an image volume and generating a compensation signal.

In a still further embodiment, the system comprises a second or more gradient compensation coils positioned adjacent to the magnet assembly, an amplifier circuit coupled between the control computer and the first and the second or more gradient compensation coils, and wherein the control computer is operable for controlling current through the first and the second or more gradient compensation coils.

In a still further embodiment, the present invention provides a system for eliminating image distortion in magnetic resonance imaging. The system comprises a magnet assembly comprising an imaging gradient coil and an imaging volume, at least one sensor generating a magnetic field change signal indicative of a magnetic field change in the imaging volume, one or more gradient compensation coils positioned adjacent to the magnet assembly operable for generating gradient compensation fields in response to the magnetic field change, and a control computer coupled to the magnet assembly, the at least one sensor, and one or more gradient compensation coils. The at least one sensor may comprise a magnetic field sensor positioned outside the imaging volume, such as a small pick-up coil or NMR sample.

In a still further embodiment, a method for counter-acting unwanted fields generated by eddy currents in conducting structures of a magnetic resonance system comprising generating a magnetic field change signal indicative of a change in a magnetic field of an image volume, determining a compensation signal in response to the magnetic field change signal, adding one or more gradient compensation coils, and controlling current through the one or more gradient compensation coils in order to cancel the unwanted fields.

In a still further aspect, a method is presented for eliminating eddy current fields in a magnet assembly comprising gradient coils. The method comprises computing eddy current fields in the magnet assembly, determining if the eddy current fields are acceptable, and if the eddy current fields are determined to be unacceptable, adding compensation coils to the magnet assembly to produce fields which counter-act the eddy current fields.

BRIEF DESCRIPTION OF THE DRAWINGS

These and other features, aspects, and advantages of the present invention are better understood when the following Detailed Description of the Invention is read with reference to the accompanying drawings, wherein.

DETAILED DESCRIPTION OF THE INVENTION

As required, detailed embodiments of the present invention are disclosed herein, however, it is to be understood that the disclosed embodiments are merely exemplary of the invention that may be embodied in various and alternative forms. Specific structural and functional details disclosed herein are not to be interpreted as limiting, but merely as a basis for the claims as a representative basis for teaching one skilled in the art to variously employ the present invention.

Figure 1:
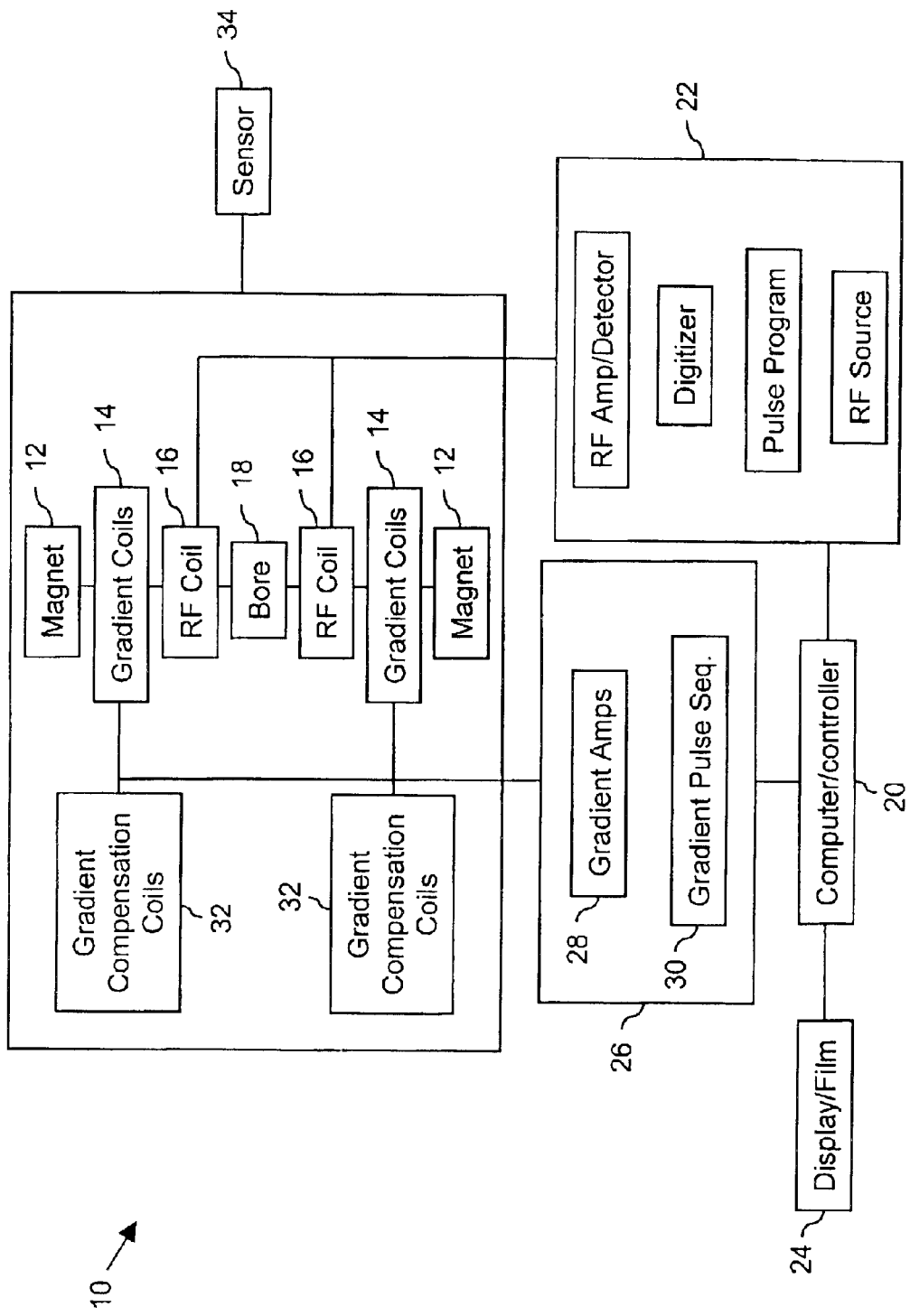
FIG. 1 is a schematic diagram of an MRI system employing gradient compensation coils in accordance with an exemplary embodiment of the present invention.

Referring now to FIG. 1, a schematic diagram of an MRI system is shown generally at 10. The MRI system 10 includes a magnet 12 operable for imposing a strong, uniform magnetic field $B_0$. The magnet 12 includes, but is not limited to, a superconducting magnet, an electromagnet, a permanent magnet or a resistive magnet. A superconducting magnet may be preferred due to the stability and strength of the static magnetic field produced. The MRI system 10 further comprises a plurality of gradient coils 14 operable for imposing magnetic field gradients in three orthogonal coordinates (x, y and z), and a plurality of radio frequency (RF) coils 16 operable for transmitting and receiving RF signals to and from selected nuclei. The RF coils 16 may be used for transmitting, receiving or both. A metallic cylinder referred to as a bore tube 18 forms a volume inside of the bore tube 18 referred to as the image volume. Although a bore-type magnet is illustrated in FIG. 1, the present invention may be practiced using open magnet systems and other known types of magnet systems. Current in the gradient coils 14 induces eddy currents in the bore tube 18 and other conducting structures of the MRI system 10 that, in turn, induce a magnetic field within the image volume.

An NMR signal received by each RF coil 16 is transmitted to a computer 20 via an RF amplification system 22. The computer 20 is operable for processing the data into an image on a display or film 24. The gradient controls 14 are controllably connected to the computer 20 via a gradient amplification system 26. The MR image is composed of picture elements referred to as "pixels", and the intensity of a given pixel is proportional to the NMR signal intensity of the contents of a corresponding volume element or "voxel" of the structure being imaged. The computer 20 controls the operation of the gradient coils 14 and the RF coils 16. In an alternative embodiment, gradient compensation coil 32 need and design is determined via computer simulation, thus eliminating the need for computer 20 control during operation.

The computer 20 may also control the magnet 12 such that a substantially uniform, temporally constant main magnetic field $B_0$ is created along the z-axis through the cylindrical bore 18, however superconducting magnets do not typically require further interaction with a control computer 20 once they have been brought to field and shimmed to the required homogeneity. A series of radio frequencies and magnetic field gradient pulses are used to invert or excite magnetic spins, induce magnetic resonance, refocus magnetic resonance, manipulate magnetic resonance and spatially and otherwise encode the magnetic resonance in order to generate magnetic resonance imaging sequences. More specifically, gradient pulse amplifiers 28 apply current pulses to the individual or pairs of shielded gradient coils 14 to create magnetic field gradients along x, y, and z axes of the image volume. A gradient pulse sequencer 30 controls the gradient pulse amplifiers 28 to generate any of a plurality of multiple echo sequences such as echo imaging, gradient and spin echo imaging, fast spin echo imaging, etc.

In MRI, the switching of magnetic field gradients is a part of the pulse sequence. The switching of the magnetic field gradients induces eddy currents in surrounding conductive materials in the magnet 12 and creates undesirable eddy current field gradients and main field ($B_0$) oscillations, which ultimately cause imaging artifacts. Conventional MRI systems add self-shielded or actively-shielded design gradient coils to active field generation coils to reduce the leakage field of the gradient. By reducing the leakage field, one reduces the induced eddy currents and thus the resultant unwanted field variation in the imaging volume. The problem with self-shielded gradient coils is their considerable cost and space needed in the magnet.

Still referring to FIG. 1, the present invention employs the addition of gradient compensation coils 32 to cancel the unwanted fields in the imaging volume. The gradient compensation coils 32 further relax the demands on the cancellation of unwanted fields from reaching conducting surfaces in the magnet 12. The gradient coils 14 and gradient compensation coils 32 are preferably electromagnetic coils that may be driven to generate a magnetic field. The computer/controller 20 is operable for controlling the various functions of the MRI system, including the control of the gradient compensation coils 32. The control computer 20 provides for gradient compensation by producing in the gradient compensation coils 32 the same field as the eddy current fields generated by the field generating coils 14. The gradient compensation coils 32 produce fields that counter-act the fields generated by the eddy currents in nearby conductors. By adding one or more gradient compensation coils, with appropriate dynamic current control through the coils controlled by the computer 20, the unwanted fields may be cancelled. As stated above, in an alternative embodiment, once the gradient compensation coil 32 need and design has been determined via computer simulation, any additional computer 20 control during operation may not be required.

The control computer 20 may be operable for applying an appropriate dynamic current control function which adjusts the current through the gradient compensation coils 32. The current is operable for causing the gradient compensation coils 32 to produce fields which counter-act the detected fields in the image volume. The number of gradient compensation coils 32 necessary to counter-act the changing fields in the image volume may vary depending upon computed eddy current fields of the image volume, and may be determined by computer simulation. Gradient compensation coils 32 may be added until fields in the imaging volume are acceptably reduced.

The MRI system 10 may further comprise at least one sensor 34 which may be positioned adjacent to the magnet 12 or in any location within the MRI system 10. The at least one sensor 34 is operable for sensing changes in the fields of the image volume. Various positions of the at least one sensor 34 may be evident to those skilled in the art, and may depend on the type of magnet 12 employed in the system 10. Examples of capable sensors 34 include, but are not limited to, NMR samples or small pick-up coils. Those skilled in the art will recognize that more than one sensor 34 may be employed in the practice of the present invention. If more than one sensor 34 is used, each sensor 34 may be disposed in a different location within the system 10. Also, more than one type of sensor 34 may be employed in the practice of the present invention.

The at least one sensor 34 is operable for detecting field changes in the image volume caused by fields generated by eddy currents in nearby conducting structures. The at least one sensor 34 may be further operable for generating a signal indicating a change in the magnetic field of the image volume. The at least one sensor 34 may directly measure the magnetic field change in the image volume.

The control computer 20 may be of a variety of types of controllers including, but not limited to a microprocessor-based controller. The control computer 20 may be a unit functioning on its own or may be incorporated into the MRI system 10 control computer 20. Depending upon the type of sensor signal from the at least one sensor 34, an analog-to-digital converter and/or digital signal processing filter may be required, as is known by those skilled in the art. The control computer 20 applies an appropriate dynamic current control function to the one or more added gradient compensation coils 32. The current control function is determined by the compensation signal input from the sensor 34. The current compensation signal sent by the control computer 20 may be provided in a number of different forms depending on the type of compensation desired. In one example, the compensation signal may be provided to the amplifier 28, which in turn is coupled to one gradient compensation coil 32 to compensate for magnetic field changes caused by eddy current in the surrounding conductive structures. In another example, the compensation signal may be provided to more than one gradient compensation coil 32.

The control computer 20, through the predetermined function, converts the sensor signal that is indicative of a magnetic field change into a compensation signal that is used to drive the gradient compensation coils 32 and minimize changes in the magnetic field due to the eddy currents in the conducting structures of the magnet 12. The magnetic field of the compensation coils 32 actively cancels the eddy current fields.

Figure 2:
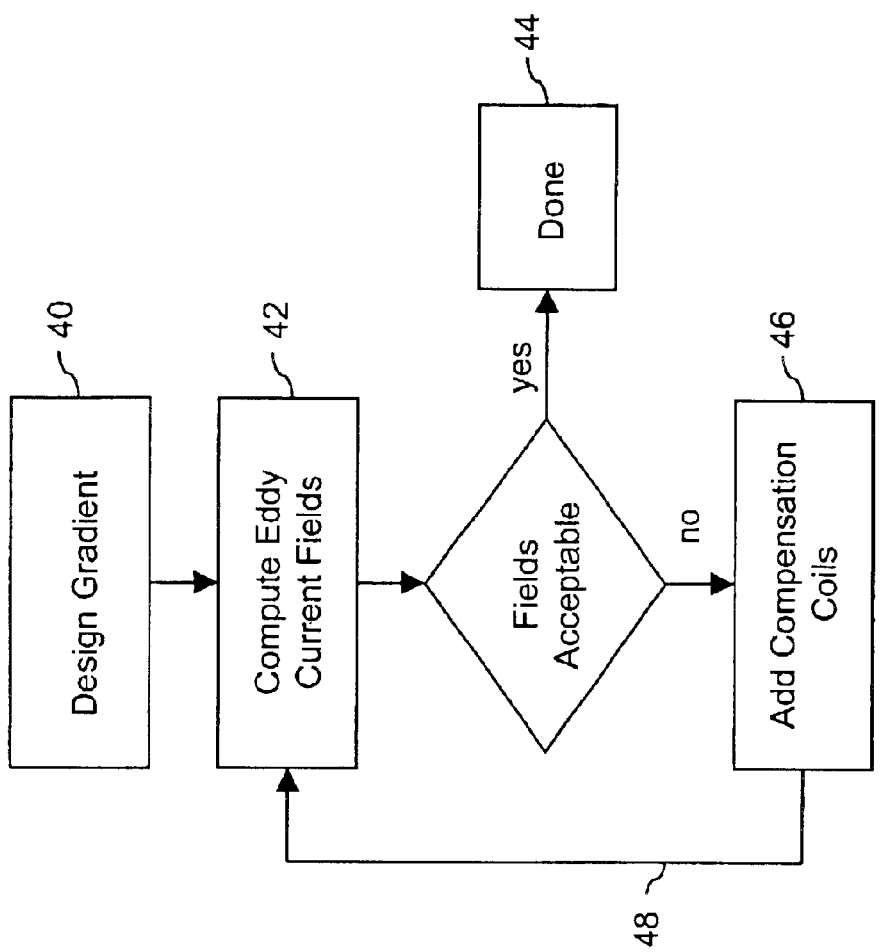
FIG. 2 is a flow chart illustrating a method for the addition of gradient compensation coils to reduce eddy current fields.

Referring to FIG. 2, a method for determining the number of compensation coils needed to effectively reduce unwanted fields in the image volume, while relaxing the demands on cancellation of unwanted fields reaching conducting surfaces in the magnet 12, is shown. In the first step (Block 40), an MRI system 10 is designed comprising a gradient design. In the next step (Block 42), eddy current fields within the image volume are computed by computer simulation programs such as Finite Element software programs well known to those skilled in the art, or by measurement such as by the at least one sensor 34 and control computer 20. If it is determined that the eddy current fields within the image volume are acceptable, then the gradient design is acceptable and the system 10 does not require the addition of compensation coils 32 (Block 44). However, if it is determined that the eddy current fields are not acceptable, gradient compensation coils 32 are added to the system 10 (block 46). The eddy current fields are then recomputed (Block 48) once the compensation coils 32 have been added, and if it is still determined that the fields are unacceptable, additional gradient compensation coils 32 may be required and/or an alternative placement of the added coils 32 may be required until the fields are effectively eliminated.

It is apparent that there have been provided systems and methods for gradient compensation in MR imaging. Although the systems and methods have been described with reference to preferred embodiments and examples thereof, other embodiments and examples may perform similar functions and/or achieve similar results. All such equivalent embodiments and examples are within the spirit and scope of the present invention and are intended to be covered by the following claims.

What is claimed is:

1. A gradient compensation system, comprising:
   a magnet assembly;
   at least one field-generating gradient coil operable for generating magnetic field gradients in three orthogonal coordinates; and
   at least one gradient compensation coil located in a predetermined position adjacent to the magnet assembly and operable for generating a magnetic field in response to a leakage field.

2. The system of claim 1, wherein the at least one gradient compensation coil is positioned in order to compensate for an eddy current field in an imaging volume.

3. The system of claim 2, further comprising at least one sensor operable for both detecting the leakage field in the imaging volume and generating a compensation signal.

4. The system of claim 1, further comprising a control computer operable for controlling current through the at least one gradient compensation coil.

5. The system of claim 1, wherein a number and the predetermined position of the at least one gradient compensation coil are determined using gradient field compensation simulation software.

6. The system of claim 1, wherein the system is operable for eliminating image distortion in magnetic resonance imaging.

7. A magnetic resonance imaging system, comprising:

a magnet assembly;

at least one field-generating gradient coil operable for generating magnetic field gradients in three orthogonal coordinates;

a cylindrical bore tube forming an imaging volume therein;

at least one radio frequency coil; and at least one gradient compensation coil disposed in a predetermined position adjacent to the magnet assembly and operable for generating a magnetic field in response to a leakage field.

8. The system of claim 7, wherein the at least one gradient compensation coil is positioned in order to compensate for an eddy current field in the imaging volume.

9. The system of claim 7, further comprising at least one sensor operable for both detecting the leakage field and generating a compensation signal.

10. The system of claim 7, wherein the system is operable for eliminating image distortion in magnetic resonance imaging.

11. The system of claim 7, wherein a number and the predetermined position of the at least one gradient compensation coil are determined using gradient field compensation simulation software.

12. The system of claim 7, further comprising a control computer operable for controlling current through the at least one gradient compensation coil.

13. The system of claim 12, further comprising an amplifier circuit coupled between the control computer and the at least one gradient compensation coil.

14. The system of claim 12, wherein the control computer is operable for controlling current through the at least one gradient compensation coil.

15. A method for counteracting an unwanted field generated by an eddy current in a conducting structure of a magnetic resonance imaging system, comprising:

generating a magnetic field change signal indicative of a change in a magnetic field of an imaging volume;

determining a compensation signal in response to the magnetic field change signal;

adding at least one gradient compensation coil adjacent to a magnet assembly in the magnetic resonance imaging system; and controlling current through the at least one gradient compensation coil.

16. The method of claim 15, further comprising measuring the change in the magnetic field of the imaging volume using at least one sensor.

* * * * *